(12) United States Patent
Kim et al.

(10) Patent No.: US 11,832,483 B2
(45) Date of Patent: *Nov. 28, 2023

(54) DISPLAY DEVICE

(71) Applicant: LG Display Co., Ltd., Seoul (KR)

(72) Inventors: Yoohwan Kim, Paju-si (KR); Sungho Cho, Paju-si (KR); Hyunjae Yoo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 225 days.

This patent is subject to a terminal disclaimer.

(21) Appl. No.: 17/343,620

(22) Filed: Jun. 9, 2021

(65) Prior Publication Data

US 2021/0305352 A1 Sep. 30, 2021

Related U.S. Application Data

(63) Continuation of application No. 16/556,591, filed on Aug. 30, 2019, now Pat. No. 11,049,925.

(30) Foreign Application Priority Data

Sep. 10, 2018 (KR) .......................... 10-2018-0107800

(51) Int. Cl.
*H01L 27/32* (2006.01)
*H01L 51/52* (2006.01)
(Continued)

(52) U.S. Cl.
CPC ......... *H10K 59/131* (2023.02); *H10K 50/814* (2023.02); *H10K 59/124* (2023.02);
(Continued)

(58) Field of Classification Search
CPC ............. H01L 27/3276; H01L 27/3211; H01L 27/3258
See application file for complete search history.

(56) References Cited

U.S. PATENT DOCUMENTS 10,845,714 B2 * 11/2020 Oh ..................... G03F 7/70633
11,049,925 B2 * 6/2021 Kim ................... H10K 59/1213
(Continued)

FOREIGN PATENT DOCUMENTS

CN 105741734 A 7/2016
KR 10-2008-0061830 A 7/2008
(Continued)

OTHER PUBLICATIONS

European Search Report dated Feb. 5, 2020 issued in corresponding European Application No. 19196130.9 (7 pages).
(Continued)

*Primary Examiner* — Dale E Page
*Assistant Examiner* — Wilner Jean Baptiste
(74) *Attorney, Agent, or Firm* — POLSINELLI PC

(57) ABSTRACT

A display device comprises a first electrode of a (1-1)-th subpixel, a first electrode of a (1-2)-th subpixel, a first electrode of a (2-1)-th subpixel, and a first electrode of a (2-2)-th subpixel; a (1-1)-th welding electrode connected to the first electrode of the (1-1)-th subpixel, a (1-2)-th welding electrode connected to the first electrode of the (1-2)-th subpixel, a (2-1)-th welding electrode connected to the first electrode of the (2-1)-th subpixel, and a (2-2)-th welding electrode connected to the first electrode of the (2-2)-th subpixel; and a first repair line overlapping the (1-1)-th welding electrode and the (2-1)-th welding electrode and a second repair line overlapping the (1-2)-th welding electrode and the (2-2)-th welding electrode, wherein the first repair line and the second repair line are disposed on different layers with at least one insulating layer interposed therebetween.

15 Claims, 17 Drawing Sheets

(51) Int. Cl.
*H10K 59/131* (2023.01)
*H10K 50/814* (2023.01)
*H10K 59/35* (2023.01)
*H10K 59/124* (2023.01)
*H10K 59/126* (2023.01)
*H10K 59/121* (2023.01)
*H01L 27/12* (2006.01)
*H10K 71/00* (2023.01)

(52) U.S. Cl.
CPC ....... *H10K 59/126* (2023.02); *H10K 59/1213* (2023.02); *H10K 59/35* (2023.02); *H01L 27/124* (2013.01); *H01L 27/1248* (2013.01); *H10K 71/861* (2023.02)

(56) References Cited

U.S. PATENT DOCUMENTS

| | | |
|---|---|---|
| 2004/0212753 A1 | 10/2004 | Wu |
| 2008/0117344 A1 | 5/2008 | Kim et al. |
| 2016/0189593 A1 | 6/2016 | Lee et al. |
| 2017/0092166 A1 | 3/2017 | Choi et al. |
| 2017/0115524 A1* | 4/2017 | Ochi ................ G02F 1/133512 |
| 2017/0345846 A1 | 11/2017 | Yang et al. |
| 2018/0052367 A1* | 2/2018 | Ma ................... G02F 1/133753 |
| 2018/0151658 A1 | 5/2018 | Jeong et al. |
| 2019/0019444 A1 | 1/2019 | Jo et al. |

FOREIGN PATENT DOCUMENTS

| | | |
|---|---|---|
| KR | 10-2016-0056390 A | 5/2016 |
| KR | 10-2016-0080868 A | 7/2016 |

OTHER PUBLICATIONS

Chinese Office Action dated Mar. 1, 2023 issued in Patent Application No. 201910796266.4 w/English Translation (12 pages).
Korean Office Action dated Jul. 20, 2023 issued in Patent Application No. 10-2018-0107800 w/English Translation (17 pages).

\* cited by examiner

○ Normally Open (Welding point)
● Normally Short

○ Normally Open (Welding point)
● Normally Short

○ Normally Open (Welding point)

DISPLAY DEVICE

CROSS REFERENCE TO RELATED APPLICATION

This application is a continuation of U.S. patent application Ser. No. 16/556,591, filed Aug. 30, 2019, which claims the priority benefit of Korean Patent Application No. 10-2018-0107800 filed on Sep. 10, 2018, which are hereby incorporated by reference in their entirety for all purposes as if fully set forth herein.

BACKGROUND

Field of the Disclosure

The present disclosure relates to a display device a display device including a repair structure for repairing a defective subpixel.

Description of the Background

Various display devices capable of reducing weight and volume, which is disadvantages of the cathode ray tube, are developed. Such display devices may be implemented as a liquid crystal display (LCD), a field emission display (FED), a plasma display panel (PDP), an organic light-emitting diode (OLED) display, etc.

From among the flat panel display devices, the OLED display is a self-emissive display device that emits light by exciting an organic compound, and has advantages in that the display can have light weight and can be made thin because it does not require a backlight used in the LCD and that the process can be simplified. Furthermore, the OLED display can be fabricated at low temperature, and is widely used because it has a high response speed of 1 ms or less and has characteristics, such as low consumption power, a wide viewing angle, and high contrast.

The OLED display includes an organic light emitting diode (OLED) for changing electrical energy into light energy. The OLED includes an anode, a cathode, and an organic emission layer positioned therebetween. In the OLED display, holes and electrons injected from the anode and the cathode, respectively, are combined in the emission layer to form excitons. The formed excitons drop from an excited state to a ground state, thus emitting and displaying an image.

Recently, research of a transparent display device is actively carried out. The transparent display device means a display device through which a user can recognize a thing, etc. positioned at the back of a display panel in addition to visual information implemented in the display panel, in front of the display panel. To this end, the transparent display device includes an emission area in which driving elements are disposed and an input image is implemented and a transmission area through which external light transmits.

In the transparent display device, the area occupied by the transmission area needs to be sufficiently secured so that a user can view background information positioned at the back of the display panel more clearly. In order to secure a required open ratio, the area occupied by the emission area needs to be sufficiently secured. Accordingly, the emission area and the transmission area need to be properly allocated within a limited space so that the transparent display device can smoothly perform its function.

A display device includes a repair structure for repairing a defective subpixel in order to improve the yield. In this case, a repair area for forming the repair structure needs to be separately allocated. However, there is a difficulty in simply introducing the repair structure into a limited space because it is difficult to allocate a separate area other than the emission area and the transmission area as described above in a transparent display device.

SUMMARY

The present disclosure provides a display device including a repair structure for repairing a defective subpixel, but having a minimized area occupied by the repair structure.

In an aspect, a display device includes first electrodes, welding electrodes, and repair lines. The first electrodes include the first electrode of a (1-1)-th subpixel, the first electrode of a (1-2)-th subpixel, the first electrode of a (2-1)-th subpixel, and the first electrode of a (2-2)-th subpixel. The welding electrodes include a (1-1)-th welding electrode connected to the first electrode of the (1-1)-th subpixel, a (1-2)-th welding electrode connected to the first electrode of the (1-2)-th subpixel, a (2-1)-th welding electrode connected to the first electrode of the (2-1)-th subpixel, and a (2-2)-th welding electrode connected to the first electrode of the (2-2)-th subpixel. The repair lines include a first repair line overlapping the (1-1)-th welding electrode and the (2-1)-th welding electrode and a second repair line overlapping the (1-2)-th welding electrode and the (2-2)-th welding electrode. The first repair line and the second repair line are disposed in different layers with at least one insulating layer interposed therebetween.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1:
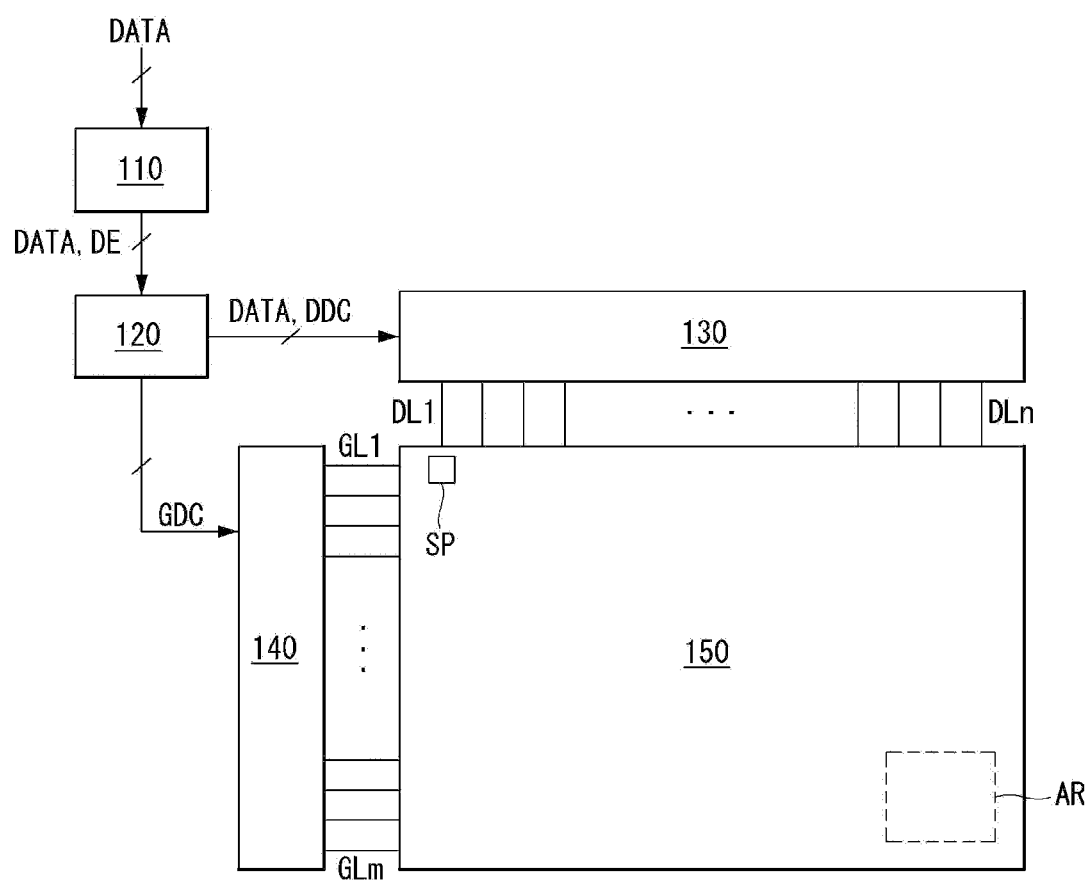
FIG. 1 shows a schematic block diagram of an OLED display.

Hereinafter, aspects of the present disclosure are described with reference to the accompanying drawings. Throughout the specification, the same reference numeral substantially denotes the same element. In the following description, a detailed description of known technology or element related to the present disclosure will be omitted if it is deemed to make the gist of the present disclosure unnecessarily vague. In describing several aspects, the same element is representatively described at the introductory part of this specification, and may be omitted in other aspects.

Terms including ordinal numbers, such as the first and the second, may be used to describe various elements, but the elements are not limited by the terms. The terms are used to only distinguish one element from the other element.

A display device according to an aspect of the present disclosure is a display device in which display elements have been formed on a substrate. The display device may be implemented as an OLED display, an LCD or an electrophoresis display device, but is hereinafter illustrated as being an OLED display, for convenience of description.

Figure 2:
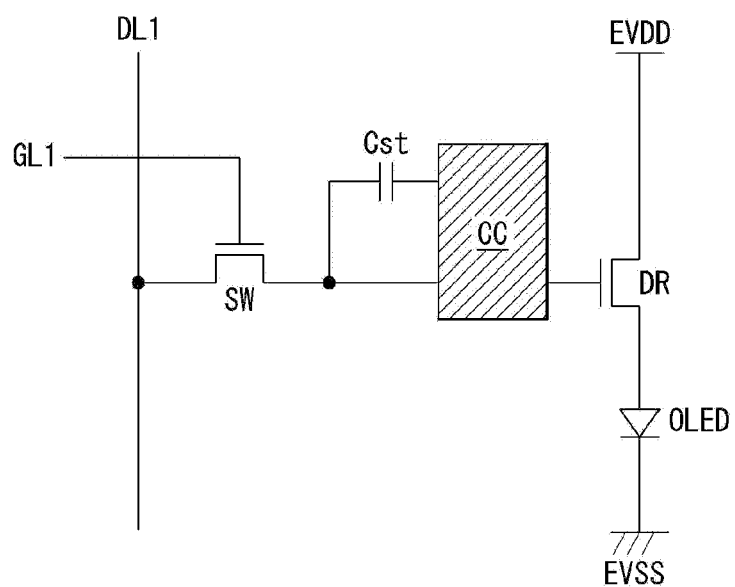
FIG. 2 shows a schematic circuit configuration of a subpixel.
Figure 3:
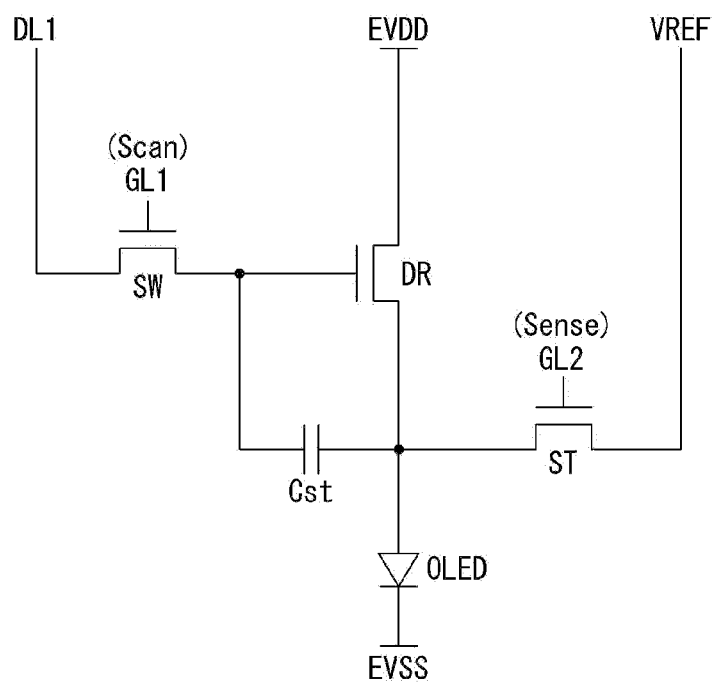
FIG. 3 illustrates a detail circuit configuration of a subpixel.

FIG. 1 shows a schematic block diagram of an OLED display. FIG. 2 shows a schematic circuit configuration of a subpixel. FIG. 3 illustrates a detail circuit configuration of a subpixel.

As shown in FIG. 1, the OLED display includes an image processor 110, a timing controller 120, a data driver 130, a scan driver 140, and a display panel 150.

The image processor 110 outputs a data enable signal DE along with a data signal DATA supplied from the outside. The image processor 110 may output one or more of a vertical sync signal, a horizontal sync signal and a clock signal in addition to the data enable signal DE, but the one or more signals are omitted, for convenience of description.

The timing controller 120 receives a data enable signal DE or a data signal DATA along with a driving signal, including a vertical sync signal, a horizontal sync signal or a clock signal, from the image processor 110. The timing controller 120 outputs a gate timing control signal GDC for controlling operating timing of the scan driver 140 and a data timing control signal DDC for controlling operating timing of the data driver 130 based on the driving signal.

The data driver 130 samples and latches a data signal DATA, supplied by the timing controller 120, in response to a data timing control signal DDC supplied by the timing controller 120, converts the signal into a gamma reference voltage, and outputs the gamma reference voltage. The data driver 130 outputs the data signal DATA through data lines DL1~DLn. The data driver 130 may be formed in an integrated circuit (IC) form.

The scan driver 140 outputs a scan signal in response to a gate timing control signal GDC supplied by the timing controller 120. The scan driver 140 outputs the scan signal through gate lines GL1~GLm. The scan driver 140 may be formed in an IC form or may be formed in the display panel 150 in a gate in panel manner.

The display panel 150 displays an image in accordance with a data signal DATA and a scan signal supplied by the data driver 130 and the scan driver 140. The display panel 150 includes subpixels SP operating to display an image.

As shown in FIG. 2, one subpixel includes a switching transistor SW, a driving transistor DR, a capacitor Cst, a compensation circuit CC, and an OLED.

The switching transistor SW performs a switching operation in response to a scan signal supplied through a first gate line GL1 so that a data signal supplied through a data line DL1 is stored in the capacitor Cst as a data voltage. The driving transistor DR operates in response to the data voltage stored in the capacitor Cst so that a driving current flows between a power line EVDD (high potential voltage) and a cathode power line EVSS (low potential voltage). The OLED operates to emit light in response to the driving current formed by the driving transistor DR.

The compensation circuit CC is a circuit added to the subpixel in order to compensate for a threshold voltage, etc. of the driving transistor DR. The compensation circuit CC is configured with one or more transistors. The compensation circuit CC may have various configurations depending on an external compensation method, and an exemplary configuration of the compensation circuit is described below.

As shown in FIG. 3, the compensation circuit CC includes a sensing transistor ST and a sensing line VREF (or reference line). The sensing transistor ST is connected between the source electrode of the driving transistor DR and the anode electrode (hereinafter referred to as a "sensing node") of the OLED. The sensing transistor ST operates to supply the sensing node of the driving transistor DR with an initialization voltage (or sensing voltage) delivered through the sensing line VREF or to sense a voltage or current of the sensing node of the driving transistor DR or the sensing line VREF.

The switching transistor SW has a drain electrode connected to the first data line DL1 and has a source electrode connected to the gate electrode of the driving transistor DR. The driving transistor DR has a drain electrode connected to the power line EVDD and has the source electrode connected to the anode electrode of the OLED. The capacitor Cst has a first capacitor electrode connected to the gate electrode of the driving transistor DR and a second capacitor electrode connected to the anode electrode of the OLED. The OLED has the anode electrode connected to the source electrode of the driving transistor DR and a cathode electrode connected to the second power line EVSS. The sensing transistor ST has a drain electrode connected to the sensing line VREF and a source electrode connected to the anode electrode of the OLED, that is, a sensing node, and the source electrode of the driving transistor DR. The transistor has been illustrated as being implemented in an n type, but the present disclosure is not limited thereto.

The operating time of the sensing transistor ST may be the same as or similar to or different from that of the switching transistor SW according to an external compensation algorithm (or the configuration of the compensation circuit). For example, the switching transistor SW may have a gate electrode connected to the first gate line GL1. The sensing transistor ST may have a gate electrode connected to a second gate line GL2. In this case, a scan signal Scan is delivered to the first gate line GL1, and a sensing signal Sense is delivered to the second gate line GL2. For another example, the first gate line GL1 connected to the gate electrode of the switching transistor SW and the second gate line GL2 connected to the gate electrode of the sensing transistor ST may be connected to be shared in common.

The sensing line VREF may be connected to the data driver. In this case, the data driver may sense the sensing node of a subpixel during a non-display period of a real-time image or an N frame (N is an integer of 1 or more) period, and may generate the results of the sensing. The switching transistor SW and the sensing transistor ST may be turned on at the same time. In this case, a sensing operation through the sensing line VREF and a data output operation of outputting a data signal based on the time division method of the data driver are separated (or divided).

In addition, a compensation target according to the results of sensing may be a data signal of a digital form, a data signal of an analog form or gamma. Furthermore, the compensation circuit generating a compensation signal (or compensation voltage) based on the results of sensing may be implemented within the data driver, within the timing controller or as a separated circuit.

In FIG. 3, a subpixel having 3 transistor (3T) 1 capacitor (1C) structure, including the switching transistor SW, the driving transistor DR, the capacitor Cst, the OLED, and the sensing transistor ST, has been illustrated, but a subpixel may be configured as 3T2C, 4T2C, 5T1C, 6T2C or the like if the compensation circuit CC is added. Hereinafter, an example in which a subpixel has a 3T 1C structure is described, for convenience of description.

Figure 4:
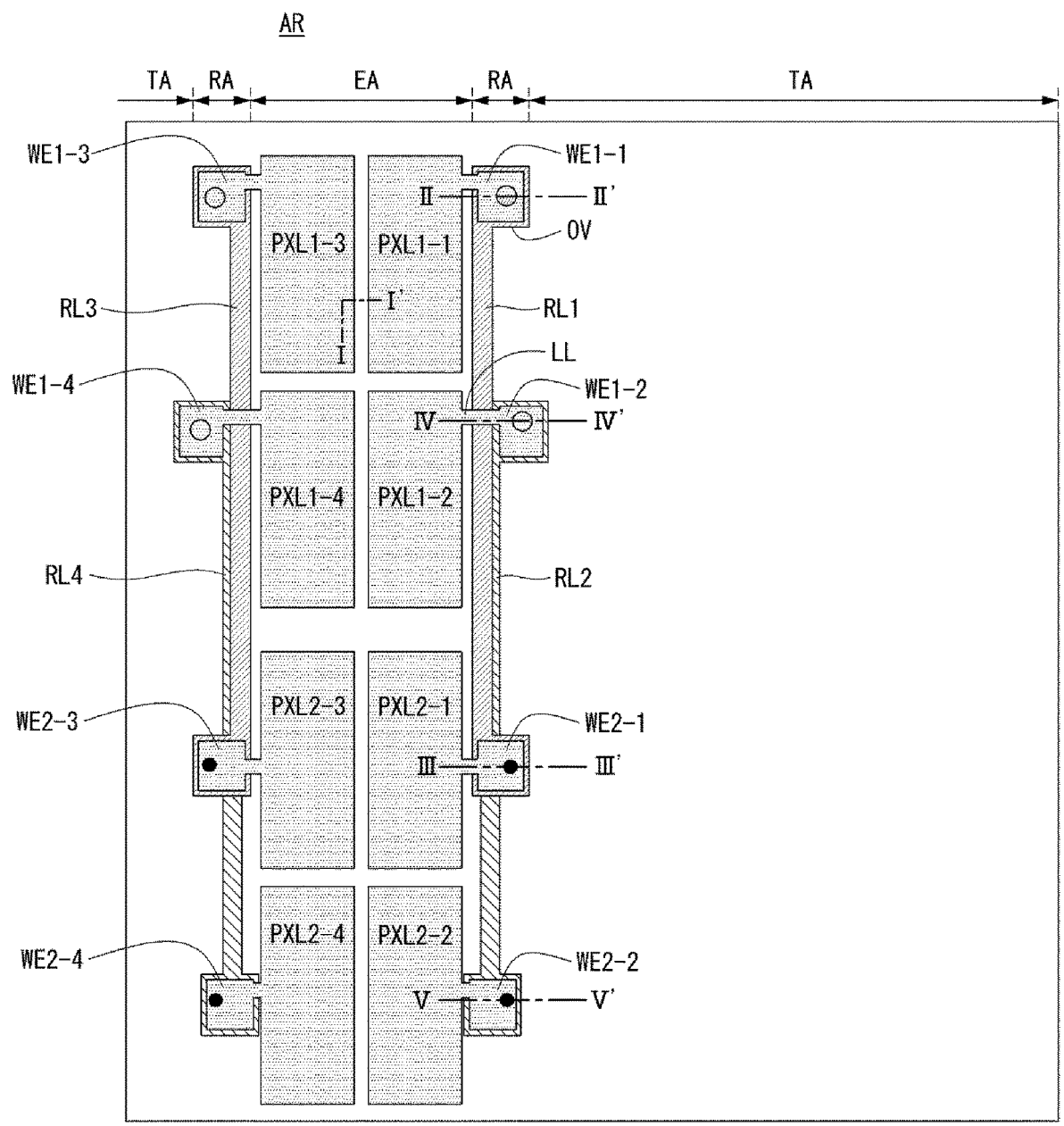
FIG. 4 relates to a first aspect of the present disclosure and is a plan view schematically showing an AR area of FIG. 1.
Figure 5:
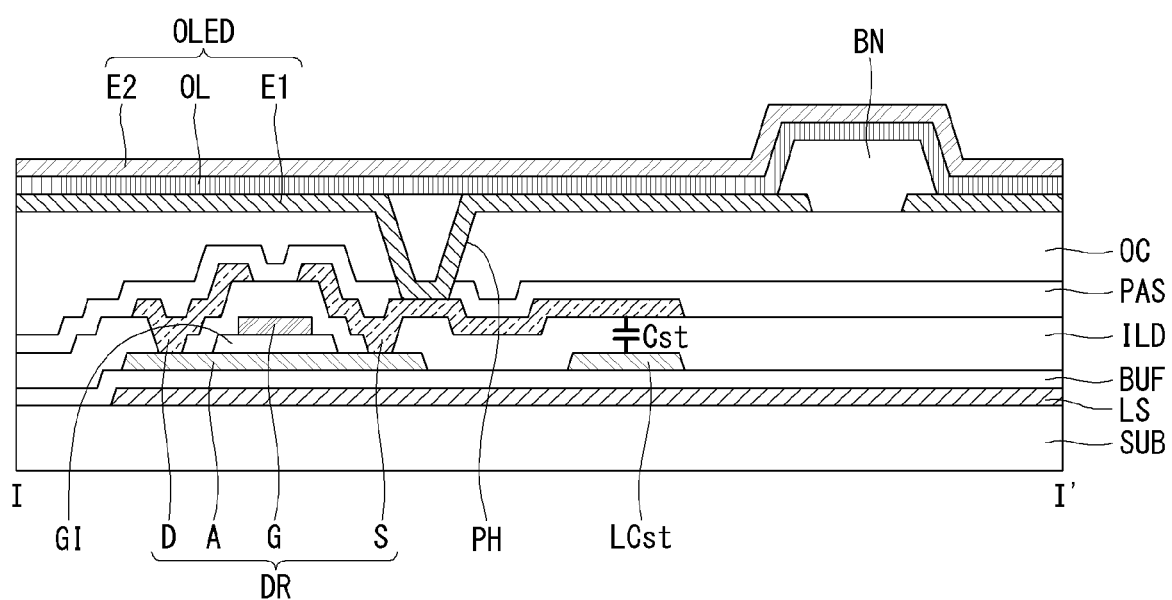
FIG. 5 is a cross-sectional view of FIG. 4, which is taken along line I-I'.

FIG. 4 relates to a first aspect of the present disclosure and is a plan view schematically showing an AR area of FIG. 1. FIG. 5 is a cross-sectional view of FIG. 4, which is taken along line I-I'. FIG. 6 is a cross-sectional view of FIG. 4, which is taken along lines II-II' and III-III', and is a cross-sectional view showing the connection relation between a first repair line and corresponding welding electrodes. FIG. 7 is a cross-sectional view of FIG. 4, which is taken along lines IV-IV' and V-V', and is a cross-sectional view showing the connection relation between a second repair line and corresponding welding electrodes.

Referring to FIG. 4, a display device according to the first aspect of the present disclosure includes pixels. The pixels may be arranged in matrix form, but are not limited thereto. The pixels include an emission area EA, a repair area RA, and a transmission area TA.

The emission area EA may be defined as an area from which light for implementing an input image is emitted. The emission area EA includes subpixels PXL, each one having a transistor and an OLED (or light-emitting device). The repair area RA may be defined as an area on which a repair process is performed when a subpixel PXL fails. The repair area RA includes a repair structure having a welding electrode WE and a repair line RL. The transmission area TA may be defined as an area through which external light transmits so that a user can recognize a thing, etc. positioned at the back of a display device. The transmission area TA may be defined as the entire area in which the elements of the emission area EA and the welding electrodes WE and repair lines RL of the repair area RA are not disposed.

The emission area EA includes the subpixels PXL. The subpixels PXL may be arranged in a first direction (e.g., Y-axis direction) and a second direction (e.g., X-axis direction) which cross each other. A pixel may include red (R), green (G), blue (B), and white (W) subpixels PXL, but is not limited thereto. Hereinafter, a configuration in which a pixel includes R, B, and W subpixels PXL is described as an example, for convenience of description.

More specifically, the emission area EA includes a first pixel and a second pixel that are adjacent in the first direction. The first pixel includes a (1-1)-th subpixel PXL1-1, a (1-2)-th subpixel PXL1-2, a (1-3)-th subpixel PXL1-3, and a (1-4)-th subpixel PXL1-4. The second pixel includes a (2-1)-th subpixel PXL2-1, a (2-2)-th subpixel PXL2-2, a (2-3)-th subpixel PXL2-3, and a (2-4)-th subpixel PXL2-4. The (1-1)-th subpixel PXL1-1 and the (2-1)-th subpixel PXL2-1 emit light of the same first color. The (1-2)-th subpixel PXL1-2 and the (2-2)-th subpixel PXL2-2 emit light of the same second color. The (1-3)-th subpixel PXL1-3 and the (2-3)-th subpixel PXL2-3 emit light of the same third color. The (1-4)-th subpixel PXL1-4 and the (2-4)-th subpixel PXL2-4 emit light of the same fourth color. Any one of red (R), green (G), blue (B), and white (W) may be allocated to each of the first color, the second color, the third color, and the fourth color.

As shown, subpixels PXL arranged in a single pixel may be arranged in a quad type. The (1-1)-th subpixel PXL1-1 and the (1-2)-th subpixel PXL1-2, and the (2-1)-th subpixel PXL2-1 and the (2-2)-th subpixel PXL2-2 may be arranged to be adjacent each other in the first direction. The (1-3)-th subpixel PXL1-3 and the (1-4)-th subpixel PXL1-4, and the (2-3)-th subpixel PXL2-3 and the (2-4)-th subpixel PXL2-4 may be arranged to be adjacent each other in the first direction. The (1-1)-th subpixel PXL1-1 and the (1-3)-th subpixel PXL1-3 may be arranged to be adjacent each other in the second direction, and the (2-1)-th subpixel PXL2-1 and the (2-3)-th subpixel PXL2-3 may be arranged to be adjacent each other in the second direction. The (1-2)-th subpixel PXL1-2 and the (1-4)-th subpixel PXL1-4 may be arranged to be adjacent each other in the second direction, and the (2-2)-th subpixel PXL2-2 and the (2-4)-th subpixel PXL2-4 may be arranged to be adjacent each other in the second direction.

Subpixels PXL emitting light of the same color are arranged in the first direction. That is, the (1-1)-th subpixel PXL1-1 and the (2-1)-th subpixel PXL2-1 may be arranged in the first direction. The (1-2)-th subpixel PXL1-2 and the (2-2)-th subpixel PXL2-2 may be arranged in the first direction. The (1-3)-th subpixel PXL1-3 and the (2-3)-th subpixel PXL2-3 may be arranged in the first direction. The (1-4)-th subpixel PXL1-4 and the (2-4)-th subpixel PXL2-4 may be arranged in the first direction.

In this case, two subpixels PXL emitting light of different colors are sequentially disposed alternately in the first direction. That is, the (1-1)-th subpixel PXL1-1 emitting light of the first color, the (1-2)-th subpixel PXL1-2 emitting light of the second color, the (2-1)-th subpixel PXL2-1 emitting light of the first color, and the (2-2)-th subpixel PXL2-2 emitting light of the second color are sequentially arranged in the first direction. Furthermore, the (1-3)-th subpixel PXL1-3 emitting light of the third color, the (1-4)-th subpixel PXL1-4 emitting light of the fourth color, the (2-3)-th subpixel PXL2-3 emitting light of the third color, and the (2-4)-th subpixel PXL2-4 emitting light of the fourth color are sequentially arranged in the first direction.

Each of the subpixels PXL includes a transistor positioned on a substrate and an OLED electrically connected to the transistor.

For example, referring to FIG. 5, a light shielding layer LS is positioned on a substrate SUB. The light shielding layer LS functions to shield the incidence of external light in order to prevent a photocurrent from occurring in the transistor. A buffer layer BUF is positioned on the light shielding layer LS. The buffer layer BUF functions to protect a TFT, formed in a subsequent process, against impurities, such as alkali ions drained from the light shielding layer LS. The buffer layer BUF may be a silicon oxide (SiOx) layer, a silicon nitride (SiNx) layer or a multi-layer thereof.

The semiconductor layer A of a driving transistor DR is positioned on the buffer layer BUF. A capacitor lower electrode LCst spaced apart from the semiconductor layer A is positioned on the buffer layer BUF. The semiconductor layer A and the capacitor lower electrode LCst may be made of a silicon semiconductor or an oxide semiconductor. The silicon semiconductor may include amorphous silicon or crystallized polycrystalline silicon. The semiconductor layer A includes a drain area and source area including p type or n type impurities, and includes a channel between the drain and source areas. The capacitor lower electrode LCst may be doped with impurities and thus become conductive.

A gate insulating film GI is positioned on the semiconductor layer A. The gate insulating film GI may be a silicon oxide (SiOx) layer, a silicon nitride (SiNx) layer or a multi-layer thereof. A gate electrode G is positioned in a given area of the semiconductor layer A, that is, at a location corresponding to a channel when impurities are implanted, on the gate insulating film GI. The gate electrode G is made of any one selected from the group consisting of molybdenum (Mo), aluminum (Al), chrome (Cr), gold (Au), titanium (Ti), nickel (Ni), neodymium (Nd), and copper (Cu) or an alloy thereof. Furthermore, the gate electrode G may be made of any one selected from the group consisting of molybdenum (Mo), aluminum (Al), chrome (Cr), gold (Au), titanium (Ti), nickel (Ni), neodymium (Nd), and copper (Cu) or may be a multi-layer having an alloy thereof. For example, the gate electrode G may be a dual layer of molybdenum/aluminum-neodymium or molybdenum/aluminum.

An interlayer dielectric layer ILD insulating the gate electrode G is positioned on the gate electrode G and the capacitor lower electrode LCst. The interlayer dielectric layer ILD may be a silicon oxide (SiOx) film, a silicon nitride (SiNx) film or a multi-layer thereof. A source electrode S and a drain electrode D are disposed on the interlayer dielectric layer ILD. The source electrode S and the drain electrode D is connected to the semiconductor layer A through contact holes through which the source area and drain area of the semiconductor layer A are exposed. The source electrode S and the drain electrode D may have a single layer or a multi-layer. If the source electrode S and the drain electrode D have a single layer, they may be made of any one selected from the group consisting of molybdenum (Mo), aluminum (Al), chrome (Cr), gold (Au), titanium (Ti), nickel (Ni), neodymium (Nd), and copper (Cu) or an alloy thereof. Furthermore, if the source electrode S and the drain electrode D have a multi-layer, they may be a dual layer of molybdenum/aluminum-neodymium or a triple layer of titanium/aluminum/titanium, molybdenum/aluminum/molybdenum or molybdenum/aluminum-neodymium/molybdenum. Accordingly, the driving transistor DR, including the semiconductor layer A, the gate electrode the source electrode S, and the drain electrode D, is configured. Furthermore, in the capacitor lower electrode LCst, a source electrode S acts as a capacitor upper electrode to configure a capacitor Cst.

A passivation film PAS is positioned over the substrate SUB, including the driving transistor DR and the capacitor Cst. The passivation film PAS is an insulating film to protect an underlying element, and may be a silicon oxide (SiOx) film or a silicon nitride (SiNx) film or a multi-layer thereof. An overcoat layer OC is positioned on the passivation film PAS. The overcoat layer OC may be a planarization film for reducing the step of a lower structure, and is made of an organic matter, such as polyimide, benzocyclobutene series resin or acrylate. The overcoat layer OC may be formed using a method, such as spin on glass (SOG) for coating the organic matter in a liquefied form and hardening it. A pixel contact hole PH through which the source electrode S is exposed by exposing the passivation film PAS is positioned in some area of the overcoat layer OC.

The OLED includes a first electrode E1, an organic emission layer OL, and a second electrode E2, which face each other.

The first electrode E1 may be an anode. The first electrode E1 is connected to the source electrode S of the driving transistor DR through the pixel contact hole PH that penetrates the overcoat layer OC and the passivation film PAS. The first electrode E1 may be made of a transparent conductive material, such as indium tin oxide (ITO), indium zinc oxide (IZO) or zinc oxide (ZnO), and thus function as a transmission electrode or may include a reflection layer and function as a reflection electrode in accordance with an adopted emission method. The reflection layer may be made of aluminum (Al), copper (Cu), silver (Ag), nickel (Ni) or an alloy thereof, and may be made of a silver/palladium/copper (APC) alloy, for example.

A bank layer BN is positioned over the substrate SUB in which the first electrode E1 has been formed. The bank layer BN may be made of an organic matter, such as polyimide, benzocyclobutene series resin or acrylate. The bank layer BN includes an opening through which most of the first electrode E1 is exposed. The bank layer BN may be positioned to expose the central part of the first electrode E1, but to cover the lateral end of the first electrode E1.

An organic emission layer OL is positioned over the substrate SUB in which the bank layer BN has been formed. The organic emission layer OL is a layer in which electrons and holes are combined to emit light. The organic emission layer OL includes an emission layer EML, and may further include one or more of a hole injection layer (HIL), a hole transport layer (HTL), an electron transport layer (ETL) or an electron injection layer (EIL).

The second electrode E2 is positioned on the organic emission layer OL. The second electrode E2 may be widely formed on the entire surface of the substrate SUB. The second electrode E2 may function as a transmission electrode or a reflection electrode in accordance with an adopted emission method. If the second electrode E2 is a transmission electrode, the second electrode E2 may be made of a transparent conductive material, such as indium tin oxide (ITO) or indium zinc oxide (IZO), or may be made of magnesium (Mg), calcium (Ca), aluminum (Al), silver (Ag) or an alloy thereof, which has a thin thickness to the extent that light can transmit the second electrode.

The repair area RA includes welding electrodes WE and repair lines RL.

A welding electrode WE is connected to the first electrode of a corresponding subpixel PXL. The welding electrode WE may be part branched from the first electrode of the subpixel PXL. The welding electrode WE is a portion where welding is performed along with a repair line RL in a repair process, and thus is formed to have a predetermined area necessary for the process.

At least one welding electrode WE may be allocated to each subpixel. A (1-1)-th welding electrode WE1-1 is connected to the first electrode of the (1-1)-th subpixel PXL1-2. A (1-2)-th welding electrode WE1-2 is connected to the first electrode of the (1-2)-th subpixel PXL1-2. A (1-3)-th welding electrode WE1-3 is connected to the first electrode of the (1-3)-th subpixel PXL1-3. A (1-4)-th welding electrode WE1-4 is connected to the first electrode of the (1-4)-th subpixel PXL1-4. A (2-1)-th welding electrode WE2-1 is connected to the first electrode of the (2-1)-th subpixel PXL2-1. A (2-2)-th welding electrode WE2-2 is connected to the first electrode of the (2-2)-th subpixel PXL2-2. A (2-3)-th welding electrode WE2-3 is connected to the first electrode of the (2-3)-th subpixel PXL2-3. A (2-4)-th welding electrode WE2-4 is connected to the first electrode of the (2-4)-th subpixel PXL2-4.

The repair line RL is extended in the first direction. One end and the other end of the repair line RL are disposed to overlap the welding electrodes WE of subpixels PXL that emit light of the same color. One end of the first repair line RL1 overlaps the (1-1)-th welding electrode WE1-1, and the other end thereof overlaps the (2-1)-th welding electrode WE2-1. One end of the second repair line RL2 overlaps the (1-2)-th welding electrode WE1-2, and the other end thereof overlaps the (2-2)-th welding electrode WE2-2. One end of the third repair line RL3 overlaps the (1-3)-th welding electrode WE1-3, and the other end thereof overlaps the (2-3)-th welding electrode WE2-3. One end of the fourth repair line RL4 overlaps the (1-4)-th welding electrode WE1-4, and the other end thereof overlaps the (2-4)-th welding electrode WE2-4.

A part that belongs to one end and the other end of the repair line RL and that overlaps the welding electrode WE may be referred to as an overlap part OV. The overlap part OV overlaps the welding electrode WE, and is welded to the welding electrode WE in a repair process. Accordingly, the overlap part is formed to have a predetermined area necessary for the process. The welding electrode WE and the overlap part OV may have the same area, but the present disclosure is not limited thereto.

In the first aspect, any one of one end and the other end of a repair line RL is connected to a corresponding welding electrode WE, and the other thereof is not connected to the corresponding welding electrode WE. For example, as shown, one end of the first repair line RL1 may be separated from the (1-1)-th welding electrode WE1-1 with an insulating layer interposed therebetween, and the other end of the first repair line RL1 may be connected to the (2-1)-th welding electrode WE2-1. One end of the second repair line RL2 may be separated from the (1-2)-th welding electrode WE1-2 with an insulating layer interposed therebetween, and the other end of the second repair line RL2 may be connected to the (2-2)-th welding electrode WE2-2. One end of the third repair line RL3 may be separated from the (1-3)-th welding electrode WE1-3 with an insulating layer interposed therebetween, and the other end of the third repair line RL3 may be connected to the (2-3)-th welding electrode WE2-3. One end of the fourth repair line RL4 may be separated from the (1-4)-th welding electrode WE1-4 with an insulating layer interposed therebetween, and the other end of the fourth repair line RL4 may be connected to the (2-4)-th welding electrode WE2-4. Hereinafter, only the configuration shown in the drawings is described as an example, for convenience of description.

Thereafter, when a defective subpixel PXL is detected in a test process, a separated repair line RL and a corresponding welding electrode WE are electrically connected by welding. For example, when the (1-1)-th subpixel PXL1-1 is determined to have failed in a test process, a signal applied to the (1-1)-th subpixel PXL1-1 is blocked through a cutting process. One end of the separated first repair line RL1 and the (1-1)-th welding electrode WE1-1 are connected through a welding process.

The first repair line RL1 and the second repair line RL2 are disposed in different layers and disposed to overlap. Furthermore, the third repair line RL3 and the fourth repair line RL4 are disposed in different layers and disposed to overlap. An aspect of the present disclosure can minimize the area of a repair area RA occupied by a repair structure because repair lines RL are disposed in different layers, but are disposed to overlap. Accordingly, an aspect of the present disclosure has an advantage in that it can provide a display device having an improved penetration ratio and open ratio by sufficiently securing a transmission area TA and/or an emission area EA.

Figure 6A:
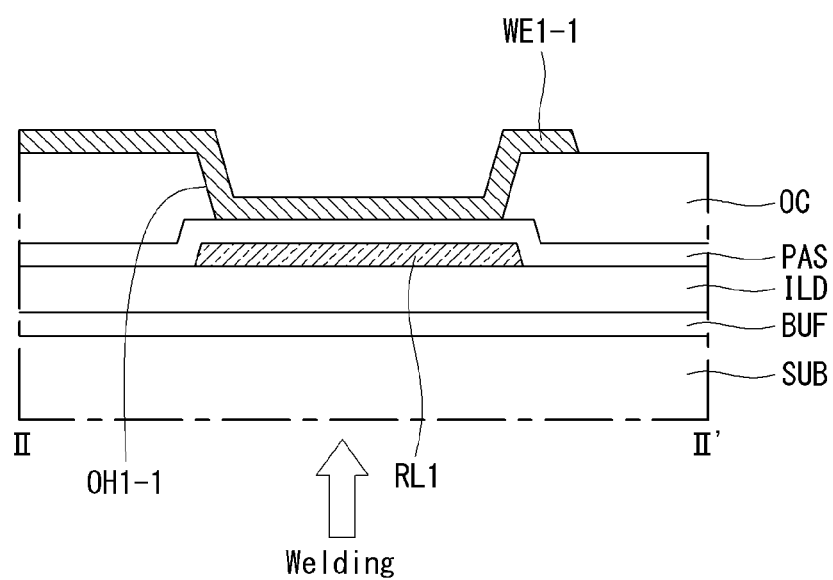
FIGS. 6A and 6B are respectively a cross-sectional view of FIG. 4, which is taken along lines II-II' and III-III', and are a cross-sectional view showing the connection relation between a first repair line and corresponding welding electrodes.
Figure 6B:
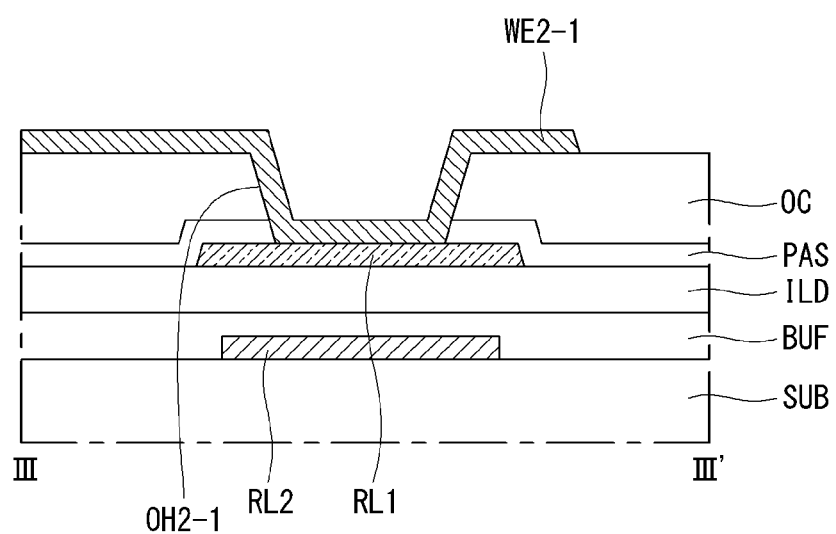

More specifically, referring to FIGS. 6A and 6B, the first repair line RL1 is formed in the same layer as the source/drain electrodes S and D of a transistor. That is, the first repair line RL1 is positioned on the interlayer dielectric layer ILD. The first repair line RL1 may be simultaneously formed using the same material as the source/drain electrodes S and D of the transistor when the source/drain electrodes S and D are formed, but the present disclosure is not limited thereto.

Referring to FIGS. 4 and 6A, the (1-1)-th welding electrode WE1-1 overlapping one end of the first repair line RL1 is formed in the same layer as a first electrode. That is, the (1-1)-th welding electrode WE1-1 is positioned on the overcoat layer OC. The (1-1)-th welding electrode WE1-1 may be part branched from the first electrode of the (1-1)-th subpixel PXL1-1. The first repair line RL1 and the (1-1)-th welding electrode WE1-1 are electrically separated with a group of insulating layer interposed therebetween, the group of insulating layer including at least one insulating layer, for example, the overcoat layer OC and the passivation film PAS.

A (1-1)-th open hole OH1-1 through which part of the passivation film PAS is exposed may be formed in the overcoat layer OC. In this case, at least part of the (1-1)-th welding electrode WE1-1 is positioned on the passivation film PAS within the (1-1)-th open hole OH1-1 penetrating the overcoat layer OC. The area where the (1-1)-th open hole OH1-1 is formed overlaps the area to which a laser is radiated. According to an aspect of the present disclosure, a welding process can be easily performed without a process failure attributable to an insulating layer thickness by previously removing the overcoat layer OC having a given thickness in the area on which the welding process is performed.

Referring to FIGS. 4 and 6B, the (2-1)-th welding electrode WE2-1 overlapping the other end of the first repair line RL1 is formed in the same layer as the first electrode. That is, the (2-1)-th welding electrode WE2-1 is positioned on the overcoat layer OC. The (2-1)-th welding electrode WE2-1 may be part branched from the first electrode of the (2-1)-th subpixel PXL2-1.

A (2-1)-th open hole OH2-1 through which part of the other end of the first repair line RL1 is exposed may be formed in the group of insulating layer, e.g., the overcoat layer OC and the passivation film PAS. The (2-1)-th open hole OH2-1 penetrates the overcoat layer OC and the passivation film PAS. At least part of the (2-1)-th welding electrode WE2-1 directly comes into contact with the first repair line RL1 through the (2-1)-th open hole OH2-1.

The second repair line RL2 is positioned in a layer different from that of the first repair line RL1 with at least one insulating layer interposed therebetween. Accordingly, the first repair line RL1 and the second repair line RL2 may be positioned to overlap.

Figure 7A:
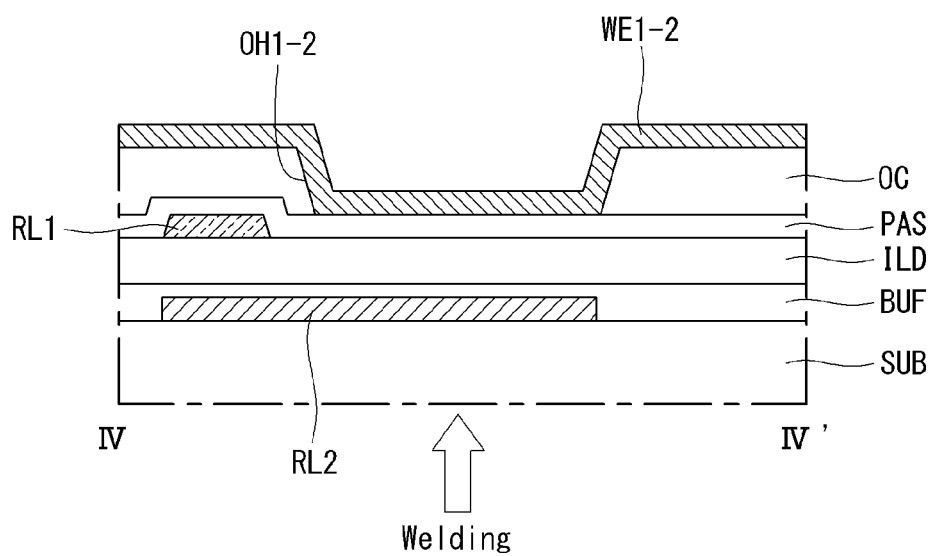
FIGS. 7A and 7B are respectively a cross-sectional view of FIG. 4, which is taken along lines IV-IV' and V-V', and are a cross-sectional view showing the connection relation between a second repair line and corresponding welding electrodes.
Figure 7B:
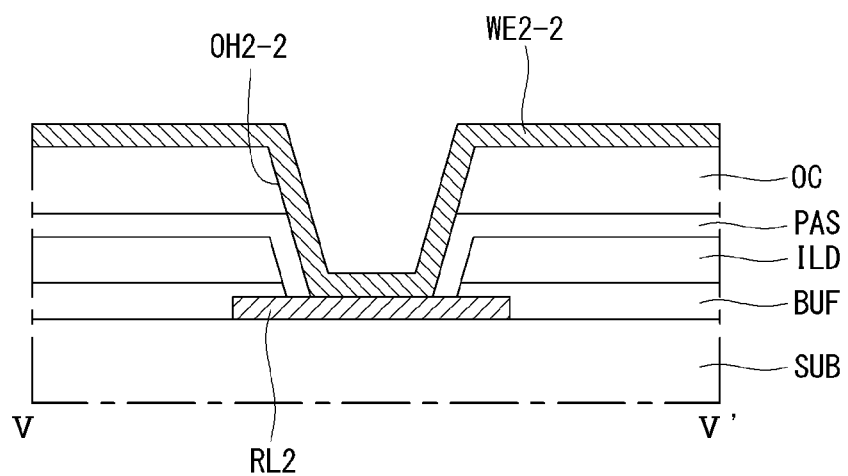

Referring to FIGS. 7A and 7B, the second repair line RL2 may be formed in the same layer as the light shielding layer LS. That is, the second repair line RL2 and the first repair line RL1 are disposed in different layers with insulating layers interposed therebetween, for example, the buffer layer BUF and the interlayer dielectric layer ILD. The second repair line RL2 may be simultaneously formed using the same material as the light shielding layer LS when the light shielding layer LS is formed, but the present disclosure is not limited thereto.

Referring to FIGS. 4 and 7A, the (1-2)-th welding electrode WE1-2 overlapping one end of the second repair line RL2 is formed in the same layer as the first electrode. That is, the (1-2)-th welding electrode WE1-2 is positioned on the overcoat layer OC. The (1-2)-th welding electrode WE1-2 may be part branched from the first electrode of the (1-2)-th subpixel PXL1-2. The second repair line RL2 and the (1-2)-th welding electrode WE1-2 are electrically separated with another group of insulating layer interposed therebetween, the another group of insulating layer including at least one insulating layer, for example, the overcoat layer OC, the passivation film PAS, the interlayer dielectric layer ILD and the buffer layer BUF.

A (1-2)-th open hole OH1-2 through which part of the passivation film PAS is exposed may be formed in the overcoat layer OC. In this case, at least part of the (1-2)-th welding electrode WE1-2 is positioned on the passivation film PAS within the (1-2)-th open hole OH1-2 penetrating the overcoat layer OC. The area in which the (1-2)-th open hole OH1-2 has been formed overlaps the area to which a laser is radiated. According to an aspect of the present disclosure, a welding process can be easily performed without a process failure attributable to an insulating layer thickness by previously removing the overcoat layer OC having a given thickness in the area on which the welding process is performed.

The (1-2)-th welding electrode WE1-2 may be positioned to not overlap the first repair line RL1 in order to prevent the (1-2)-th welding electrode WE1-2 and the first repair line RL1 from being connected during a welding process. In this case, the first electrode of the (1-2)-th subpixel and the (1-2)-th welding electrode WE1-2 may be connected through a link line LL. In order to secure a penetration ratio, the area of the link line LL may be configured to be narrower than that of the (1-2)-th welding electrode WE1-2.

Referring to FIGS. 4 and 7(b), the (2-2)-th welding electrode WE2-2 overlapping the other end of the second repair line RL2 is formed in the same layer as the first electrode. That is, the (2-2)-th welding electrode WE2-2 is positioned on the overcoat layer OC. The (2-2)-th welding electrode WE2-2 may be part branched from the first electrode of the (2-2)-th subpixel PXL2-2.

A (2-2)-th open hole OH2-2 through which part of the other end of the second repair line RL2 is exposed is formed in the another group of insulating layer, e.g., the overcoat layer OC, the passivation film PAS, the interlayer dielectric layer ILD, and the buffer layer BUF. The (2-2)-th open hole OH2-2 penetrates the overcoat layer OC, the passivation film PAS, the interlayer dielectric layer ILD, and the buffer layer BUF. At least part of the (2-2)-th welding electrode WE2-2 directly comes into contact with the second repair line RL2 through the (2-2)-th open hole OH2-2. As shown, the (2-2)-th open hole OH2-2 may be formed through two processes in order to facilitate the process. For example, the (2-2)-th open hole OH2-2 may be configured with a contact hole penetrating the interlayer dielectric layer ILD and the buffer layer BUF and a contact hole penetrating the overcoat layer OC and the passivation film PAS.

Although not shown, the connection structure of the first repair line RL1 may be configured like FIGS. 7A and (b), and the connection structure of the second repair line RL2 may be configured like FIGS. 6A and (b). Furthermore, although not shown, any one of the connection structure of the third repair line RL3 and the connection structure of the fourth repair line RL4 may be configured like FIGS. 6A and (b), and the other thereof may be configured like FIGS. 7A and (b).

Figure 8:
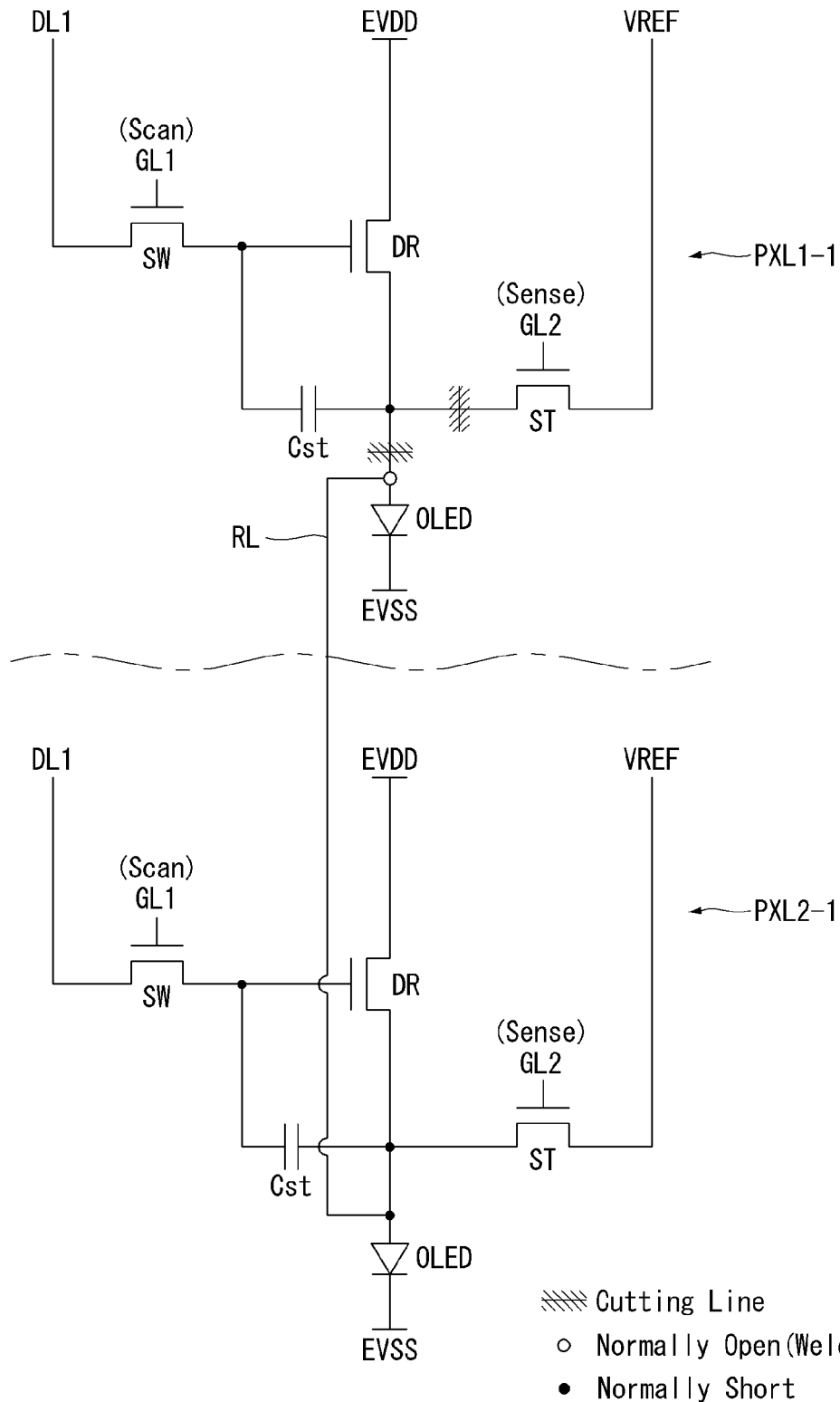
FIG. 8 shows a schematic circuit configuration of a subpixel for illustrating a repair process and repair structure according to a first aspect of the present disclosure.

FIG. 8 shows a schematic circuit configuration of a subpixel for illustrating a repair process and repair structure according to a first aspect of the present disclosure.

A display device according to the first aspect of the present disclosure includes a repair structure for performing a repair process. The repair process may include a test process for detecting whether a subpixel PXL has failed, a cutting process for blocking a signal applied to a subpixel PXL determined to have failed, and a welding process for connecting an adjacent subpixel PXL and the defective subpixel PXL in order to apply the signal of the adjacent subpixel PXL to the defective subpixel PXL.

Referring to FIG. 8, the first subpixel PXL1-1 and the second subpixel PXL2-1 are subpixels PXL that emit light of the same color. When the first subpixel PXL1-1 is determined to have failed in a test process, a cutting process for blocking a signal applied to the first subpixel PXL1-1 is performed. For example, as shown, the cutting process may include a process of cutting the line between the source electrode of a driving transistor DR and the first electrode of an OLED and a process of cutting the line between the source electrode of the sensing transistor ST and the first electrode of the OLED.

Thereafter, a welding process for connecting the first electrode of the first subpixel PXL1-1 and the first electrode of the second subpixel PXL2-1 is performed. In the first aspect, the repair line RL is electrically connected to any one of the first electrode of the first subpixel PXL1-1 and the first electrode of the second subpixel PXL2-1. Accordingly, in the welding process, only a process of electrically connecting the repair line RL to the other of the first electrode of the first subpixel PXL1-1 and the first electrode of the second subpixel PXL2-1 is performed.

Figure 9:
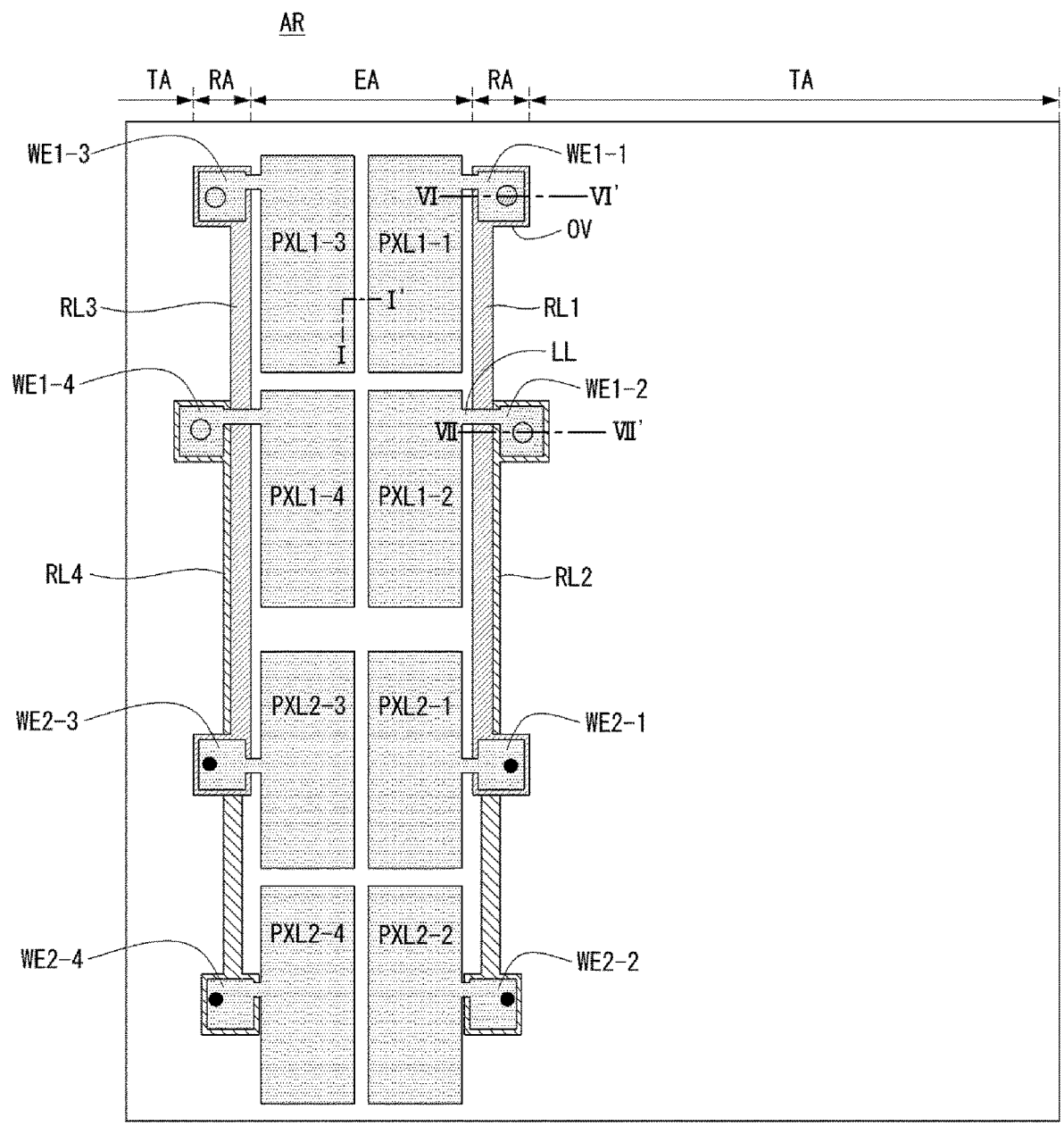
FIG. 9 relates to a second aspect of the present disclosure and is a plan view schematically showing area AR of FIG. 1.
Figure 10:
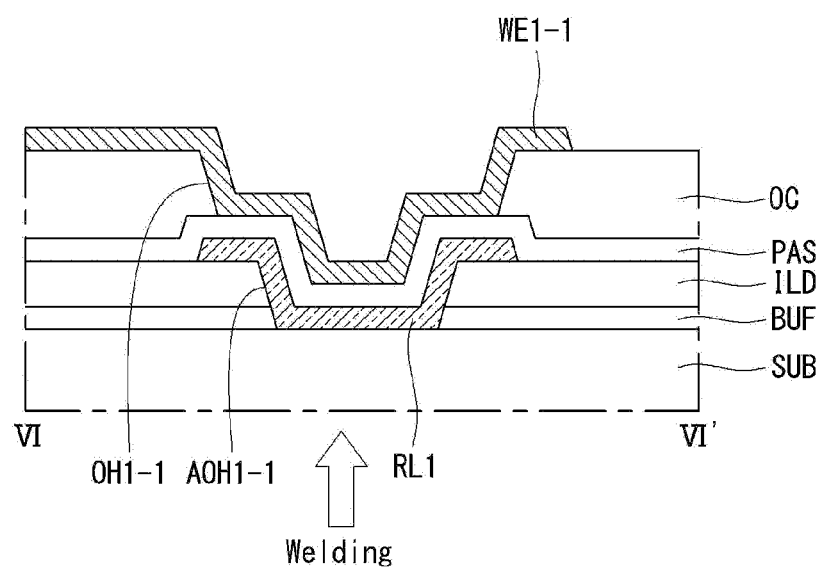
FIG. 10 is a cross-sectional view of FIG. 9, which is taken along line VI-VI', and is a cross-sectional view showing the connection relation between the first repair line and corresponding welding electrodes.
Figure 11:
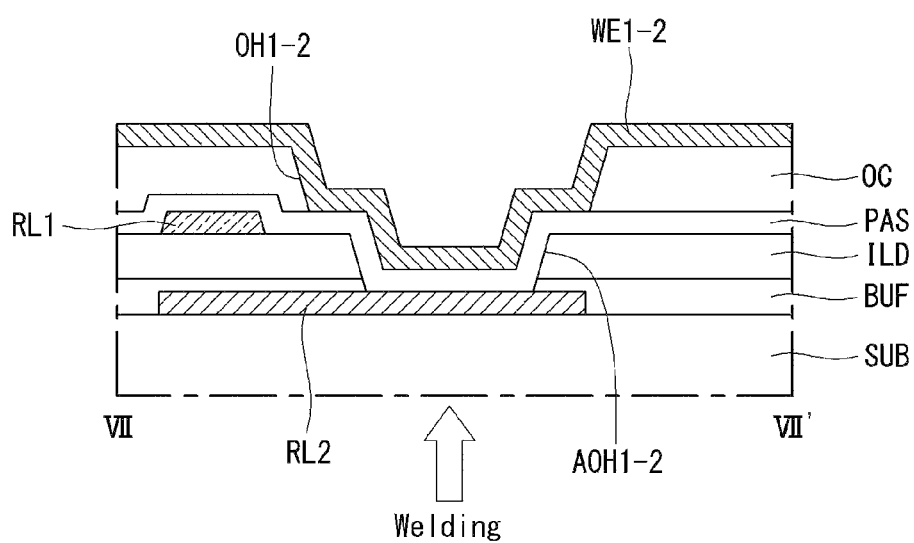
FIG. 11 is a cross-sectional view of FIG. 9, which is taken along line VII-VII', and is a cross-sectional view showing the connection relation between the second repair line and corresponding welding electrodes.

FIG. 9 relates to a second aspect of the present disclosure and is a plan view schematically showing the AR area of FIG. 1. FIG. 10 is a cross-sectional view of FIG. 9, which is taken along line VI-VI', and is a cross-sectional view showing the connection relation between the first repair line and corresponding welding electrodes. FIG. 11 is a cross-sectional view of FIG. 9, which is taken along line VII-VII', and is a cross-sectional view showing the connection relation between the second repair line and corresponding welding electrodes. In describing the second aspect, a description of an element that is substantially the same as that of the first aspect is omitted.

Referring to FIG. 9, a first repair line RL1 and a second repair line RL2 are disposed in different layers and disposed to overlap. Furthermore, a third repair line RL3 and a fourth repair line RL4 are disposed in different layers and disposed to overlap. In an aspect of the present disclosure, the area of a repair area RA occupied by a repair structure can be minimized by disposing repair lines RL in different layers, but overlapping them. Accordingly, an aspect of the present disclosure has an advantage in that it can provide a display device having an improved penetration ratio and open ratio by sufficiently securing a transmission area TA and/or an emission area EA.

More specifically, referring to FIGS. 9 and 10, the first repair line RL1 is formed in the same layer as the source/drain electrodes S and D of a transistor. That is, the first repair line RL1 is positioned on an interlayer dielectric layer ILD. The first repair line RL1 may be simultaneously formed using the same material as the source/drain electrodes S and D of the transistor when the source/drain electrodes S and D are formed, but the present disclosure is not limited thereto.

A (1-1)-th welding electrode WE1-1 overlapping one end of the first repair line RL1 is formed in the same layer as a first electrode. That is, the (1-1)-th welding electrode WE1-1 is positioned on an overcoat layer OC. The (1-1)-th welding electrode WE1-1 may be part branched from the first electrode of a (1-1)-th subpixel PXL1-1. The first repair line RL1 and the (1-1)-th welding electrode WE1-1 are electrically separated with a group of insulating layer interposed therebetween, the group of insulating layer including at least one insulating layer, for example, the overcoat layer OC and the passivation film PAS.

A (1-1)-th open hole OH1-1 through which part of a passivation film PAS is exposed may be formed in the overcoat layer OC. In this case, at least some of the (1-1)-th welding electrode WE1-1 is positioned on the passivation film PAS within the (1-1)-th open hole OH1-1 penetrating the overcoat layer OC. The area where the (1-1)-th open hole OH1-1 has been formed overlaps the area to which a laser is radiated. According to an aspect of the present disclosure, a welding process can be easily performed without a process failure attributable to an insulating layer thickness by previously removing the overcoat layer OC having a given thickness in the area on which the welding process is performed.

A (1-1)-th auxiliary open hole AOH1-1 through which part of a substrate SUB is exposed may be formed in the interlayer dielectric layer ILD and a buffer layer BUF disposed under the first repair line RL1. In this case, at least part of one end of the first repair line RL1 is positioned on the substrate SUB within the (1-1)-th auxiliary open hole AOH1-1. The area in which the (1-1)-th auxiliary open hole AOH1-1 has been formed overlaps the area to which a laser is radiated. Furthermore, the area in which the (1-1)-th open hole OH1-1 has been formed overlaps the area in which the (1-1)-th auxiliary open hole AOH1-1 has been formed. According to an aspect of the present disclosure, a welding process can be easily performed without a process failure attributable to an insulating layer thickness by previously removing the interlayer dielectric layer ILD and the buffer layer BUF having a given thickness in the area on which the welding process is performed. Although not shown, the (1-1)-th auxiliary open hole AOH1-1 may penetrate only the interlayer dielectric layer ILD. In this case, at least part of the first repair line RL1 may be positioned on the buffer layer BUF within the (1-1)-th auxiliary open hole AOH1-1.

Referring to FIGS. 9 and 11, the second repair line RL2 may be formed in the same layer as a light shielding layer LS. That is, the second repair line RL2 and the first repair line RL1 are disposed in different layers with insulating layers, for example, the buffer layer BUF and the interlayer dielectric layer ILD interposed therebetween. The second repair line RL2 may be simultaneously formed using the same material as the light shielding layer LS when the light shielding layer is formed, but the present disclosure is not limited thereto.

A (1-2)-th welding electrode WE1-2 overlapping one end of the second repair line RL2 is formed in the same layer as the first electrode. That is, the (1-2)-th welding electrode WE1-2 is positioned on the overcoat layer OC. The (1-2)-th welding electrode WE1-2 may be part branched from the first electrode of the (1-2)-th subpixel PXL1-2. The second repair line RL2 and the (1-2)-th welding electrode WE1-2 are electrically separated with another group of insulating layer interposed therebetween, the another group of insulating layer including at least one insulating layer, for example, the overcoat layer OC, the passivation film PAS, the interlayer dielectric layer ILD and the buffer layer BUF.

A (1-2)-th open hole OH1-2 through which part of the passivation film PAS is exposed may be formed in the overcoat layer OC. In this case, at least part of the (1-2)-th welding electrode WE1-2 is positioned on the passivation film PAS within the (1-2)-th open hole OH1-2 penetrating the overcoat layer OC. The area in which the (1-2)-th open hole OH1-2 has been formed overlaps the area to which a laser is radiated. According to an aspect of the present disclosure, a welding process can be easily performed without a process failure attributable to an insulating layer thickness by previously removing the overcoat layer OC having a given thickness in the area on which the welding process is performed.

A (1-2)-th auxiliary open hole AOH1-2 through which part of the second repair line RL2 is exposed may be formed in the interlayer dielectric layer ILD and the buffer layer BUF. In this case, the second repair line RL2 and the (1-2)-th welding electrode WE1-2 may be disposed in different layers with only the passivation film PAS interposed therebetween. The area in which the (1-2)-th auxiliary open hole AOH1-2 has been formed overlaps the area to which a laser is radiated. According to an aspect of the present disclosure, a welding process can be easily performed without a process failure attributable to an insulating layer thickness by previously removing the interlayer dielectric layer ILD and the buffer layer BUF having a given thickness in the area on which the welding process is performed. Although not shown, the (1-2)-th auxiliary open hole AOH1-2 may penetrate only the interlayer dielectric layer ILD.

Although not shown, the connection structure of the first repair line RL1 may be configured like FIG. 11 and the connection structure of the second repair line RL2 may be configured like FIG. 10. Furthermore, although not shown, any one of the connection structure of the third repair line RL3 and the connection structure of the fourth repair line RL4 may be configured like FIG. 10, and the other thereof may be configured like FIG. 11.

<Third Aspect>

Figure 12:
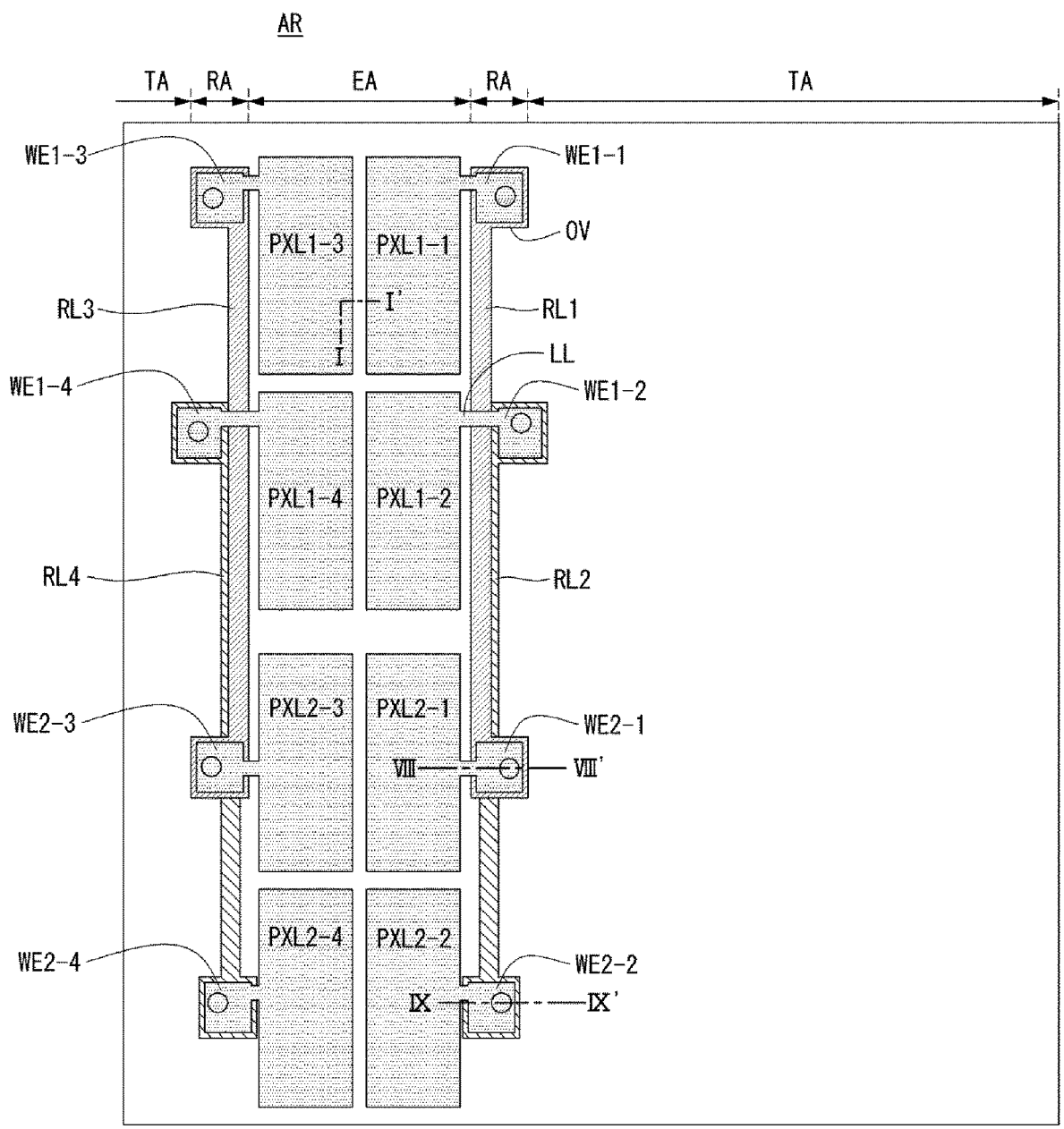
FIG. 12 relates to a third aspect of the present disclosure and is a plan view schematically showing area AR of FIG. 1.
Figure 13:
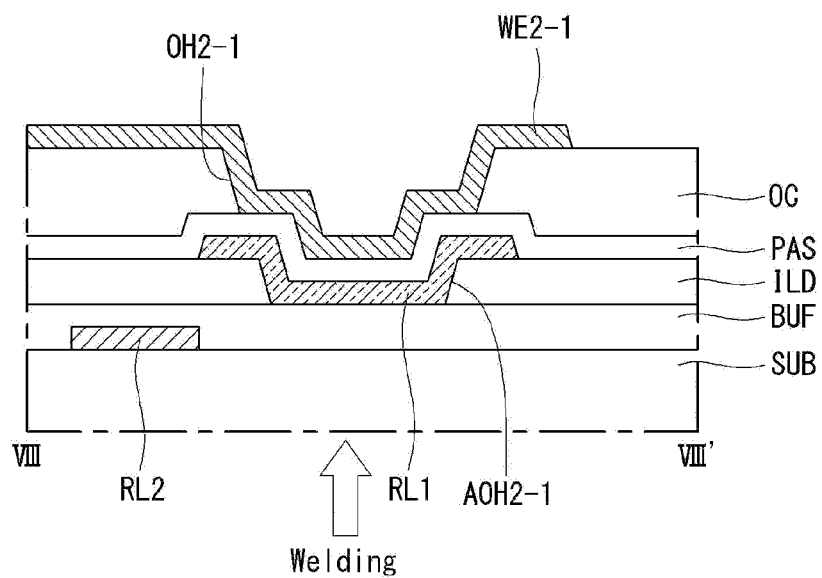
FIG. 13 is a cross-sectional view of FIG. 12, which is taken along line VIII-VIII', and is a cross-sectional view showing the connection relation between one end of the first repair line and corresponding welding electrodes.
Figure 14:
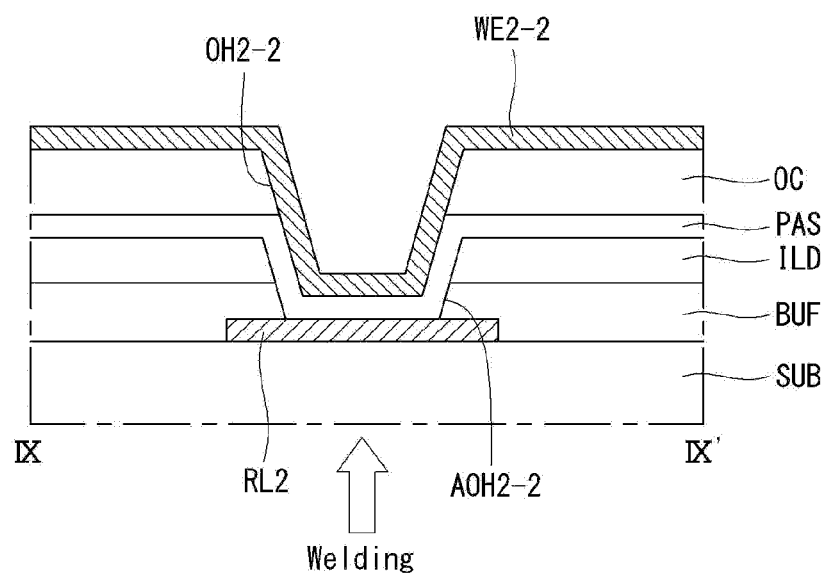
FIG. 14 is a cross-sectional view of FIG. 12, which is taken along line IX-IX', and is a cross-sectional view showing the connection relation between the second repair line and corresponding welding electrodes.

FIG. 12 relates to a third aspect of the present disclosure and is a plan view schematically showing the AR area of FIG. 1. FIG. 13 is a cross-sectional view of FIG. 12, which is taken along line VIII-VIII', and is a cross-sectional view showing the connection relation between one end of the first repair line and corresponding welding electrodes. FIG. 14 is a cross-sectional view of FIG. 12, which is taken along line IX-IX', and is a cross-sectional view showing the connection relation between the second repair line and corresponding welding electrodes. In describing the third aspect, a description of an element that is substantially the same as that of the first and second aspects is omitted.

Referring to FIG. 12, in the third aspect, both one end and the other end of a repair line RL is not connected to a welding electrode. For example, as shown, one end of a first repair line RL1 is separated from a (1-1)-th welding electrode WE1-1 with an insulating layer interposed therebetween, and the other end of the first repair line RL1 is separated from a (2-1)-th welding electrode WE2-1 with an insulating layer interposed therebetween. One end of a second repair line RL2 is separated from a (1-2)-th welding electrode WE1-2 with an insulating layer interposed therebetween, and the other end of the second repair line RL2 is separated from a (2-2)-th welding electrode WE2-2 with an insulating layer interposed therebetween. One end of a third repair line RL3 is separated from a (1-3)-th welding electrode WE1-3 with an insulating layer interposed therebetween, and the other end of the third repair line RL3 is separated from a (2-3)-th welding electrode WE2-3 with an insulating layer interposed therebetween. One end of a fourth repair line RL4 is separated from a (1-4)-th welding electrode WE1-4 with an insulating layer interposed therebetween, and the other end of the fourth repair line RL4 is separated from a (2-4)-th welding electrode WE2-4 with an insulating layer interposed therebetween.

Thereafter, when a defective subpixel PXL is detected in a test process, a separated repair line RL and a corresponding welding electrode WE are electrically connected through welding. For example, when the (1-1)-th subpixel PXL1-1 is determined to have failed in a test process, a signal applied to the (1-1)-th subpixel PXL1-1 is blocked through a cutting process, one end of the separated first repair line RL1 and the (1-1)-th welding electrode WE1-1 are connected through a welding process, and the other end of the separated first repair line RL1 and the (2-1)-th welding electrode WE2-1 are connected.

The first repair line RL1 and the second repair line RL2 are disposed in different layers and disposed to overlap. Furthermore, the third repair line RL3 and the fourth repair line RL4 are disposed in different layers and disposed to overlap. According to an aspect of the present disclosure, the area of a repair area RA occupied by a repair structure can be minimized by disposing repair lines RL in different layers, but overlapping the repair lines. Accordingly, an aspect of the present disclosure has an advantage in that it can provide a display device having an improved penetration ratio and open ratio by sufficiently securing a transmission area TA and/or an emission area EA.

More specifically, referring to FIGS. 12 and 13, the first repair line RL1 is formed in the same layer as the source/drain electrodes S and D of a transistor. That is, the first repair line RL1 is positioned on an interlayer dielectric layer ILD. The first repair line RL1 may be simultaneously formed using the same material as the source/drain electrodes S and D of the transistor when the source/drain electrodes S and D are formed, but the present disclosure is not limited thereto.

Although not shown, the deployment structure of one end of the first repair line RL1 and the (1-1)-th welding electrode WE1-1 may be the same as the structure shown in FIG. 6A of the first aspect or the structure shown in FIG. 10 (of the second aspect.

The (2-1)-th welding electrode WE2-1 overlapping the other end of the first repair line RL1 is formed in the same layer as a first electrode. That is, the (2-1)-th welding electrode WE2-1 is positioned on an overcoat layer OC. The (2-1)-th welding electrode WE2-1 may be part branched from the first electrode of the (2-1)-th subpixel PXL2-1. The first repair line RL1 and the (2-1)-th welding electrode WE2-1 are electrically separated with a group of insulating layer interposed therebetween, the group of insulating layer including at least one insulating layer, for example, the overcoat layer OC and the passivation film PAS.

A (2-1)-th open hole OH2-1 through which part of a passivation film PAS is exposed may be formed in the overcoat layer OC. In this case, at least part of the (2-1)-th welding electrode WE2-1 is positioned on the passivation film PAS within the (2-1)-th open hole OH2-1 penetrating the overcoat layer OC. The area in which the (2-1)-th open hole OH2-1 has been formed overlaps the area to which a laser is radiated. According to an aspect of the present disclosure, a welding process can be easily performed without a process failure attributable to an insulating layer thickness by previously removing the overcoat layer OC having a given thickness in the area on which the welding process is performed.

A (2-1)-th auxiliary open hole AOH2-1 through which part of the buffer layer BUF is exposed may be formed in the interlayer dielectric layer ILD positioned under the first repair line RL1. In this case, at least part of the other end of the first repair line RL1 is positioned on a buffer layer BUF within the (2-1)-th auxiliary open hole AOH2-1. Furthermore, the area in which the (2-1)-th auxiliary open hole AOH2-1 has been formed overlaps the area to which a laser is radiated. According to an aspect of the present disclosure, a welding process can be easily performed without a process failure attributable to an insulating layer thickness by previously removing the interlayer dielectric layer ILD having a given thickness in the area on which the welding process is performed. Although not shown, the (2-1)-th auxiliary open hole AOH2-1 may be formed to penetrate both the interlayer dielectric layer ILD and the buffer layer BUF.

Referring to FIGS. 12 and 14, the second repair line RL2 may be formed in the same layer as a light shielding layer LS. The second repair line RL2 may be simultaneously formed using the same material as the light shielding layer LS when the light shielding layer LS is formed, but the present disclosure is not limited thereto.

Although not shown, the deployment structure of one end of the second repair line RL2 and the (1-2)-th welding electrode WE1-2 may be the same as the structure shown in FIG. 7A of the first aspect or the structure shown in FIG. 11 of the second aspect.

The (2-2)-th welding electrode WE2-2 overlapping the other end of the second repair line RL2 is formed in the same layer as the first electrode. That is, the (2-2)-th welding electrode WE2-2 is positioned on the overcoat layer OC. The (2-2)-th welding electrode WE2-2 may be part branched from the first electrode of the (2-2)-th subpixel PXL2-2. The second repair line RL2 and the (2-2)-th welding electrode WE2-2 are electrically separated with another group of insulating layer interposed therebetween, the another group of insulating layer including at least one insulating layer, for example, the overcoat layer OC, the passivation film PAS, the interlayer dielectric layer ILD and the buffer layer BUF.

A (2-2)-th open hole OH2-2 through which part of the passivation film PAS is exposed may be formed in the overcoat layer OC. In this case, at least part of the (2-2)-th welding electrode WE2-2 is positioned on the passivation film PAS within the (2-2)-th open hole OH2-2 penetrating the overcoat layer OC. The area in which the (2-2)-th open hole OH2-2 has been formed overlaps the area to which a laser is radiated. According to an aspect of the present disclosure, a welding process can be easily performed without a process failure attributable to an insulating layer thickness by previously removing the overcoat layer OC having a given thickness in the area on which the welding process is performed.

A (2-2)-th auxiliary open hole AOH2-2 through which part of the second repair line RL2 is exposed may be formed in the interlayer dielectric layer ILD and the buffer layer BUF. In this case, the second repair line RL2 and the (2-2)-th welding electrode WE2-2 may be disposed in different layers with only the passivation film PAS interposed therebetween. The area in which the (2-2)-th auxiliary open hole AOH2-2 has been formed overlaps the area to which a laser is radiated. According to an aspect of the present disclosure, a welding process can be easily performed without a process failure attributable to an insulating layer thickness by previously removing the interlayer dielectric layer ILD and the buffer layer BUF having a given thickness in the area on which the welding process is performed. Although not shown, the (2-2)-th auxiliary open hole AOH2-2 may penetrate only the interlayer dielectric layer ILD FIG. 15 shows a schematic circuit configuration of a subpixel for illustrating a repair process and structure according to a third aspect of the present disclosure.

A display device according to the third aspect of the present disclosure includes a repair structure for performing a repair process. The repair process may include a test process for detecting whether a subpixel PXL has failed, a cutting process for blocking a signal applied to a subpixel PXL determined to have failed, and a welding process for connecting an adjacent subpixel PXL and the defective subpixel PXL in order to apply the signal of the adjacent subpixel PXL to the defective subpixel PXL.

Figure 15:
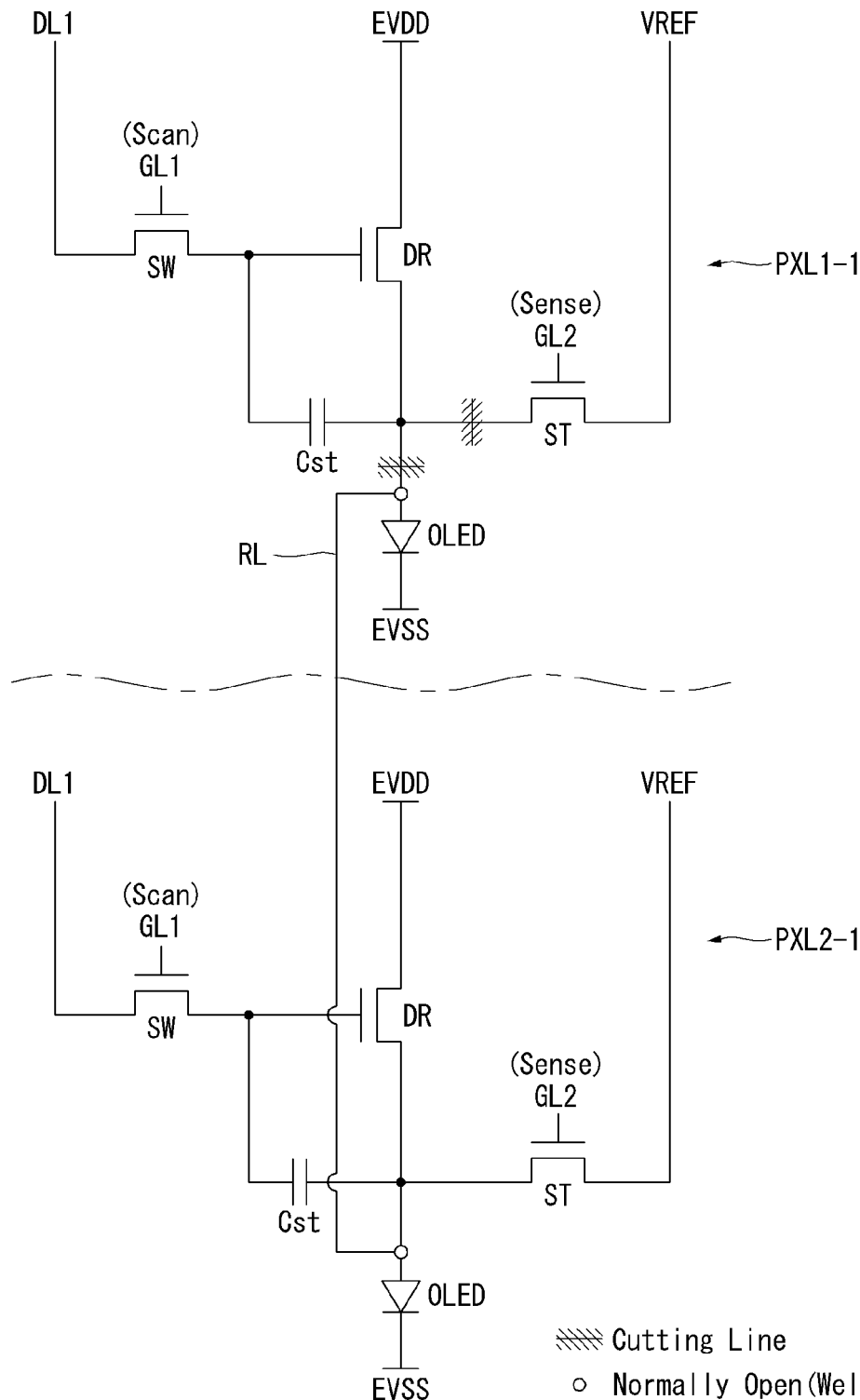
FIG. 15 shows a schematic circuit configuration of a subpixel for illustrating a repair process and repair structure according to a third aspect of the present disclosure.

Referring to FIG. 15, a first subpixel PXL1-1 and a second subpixel PXL2-1 are subpixels PXL emitting light of the same color. When the first subpixel PXL1-1 is determined to have failed in a test process, a cutting process for blocking a signal applied to the first subpixel PXL1-1 is performed. For example, as shown, the cutting process may include a process of cutting the line between the source electrode of a driving transistor DR and the first electrode of an OLED and a process of cutting the line between the source electrode of a sensing transistor ST and the first electrode of the OLED.

Thereafter, a welding process for connecting the first electrode of the first subpixel PXL1-1 and the first electrode of the second subpixel PXL2-1 is performed. In the third aspect, a repair line RL is electrically separated from both the first electrode of the first subpixel PXL1-1 and the first electrode of the second subpixel PXL2-1. Accordingly, in the welding process, a process of electrically connecting both the first electrode of the first subpixel PXL1-1 and the first electrode of the second subpixel PXL2-1 to the repair line RL is performed.

Although the transparent display device has been described above, it should be understood that the repair structure of the disclosure can also be applied to a normal display device which does not include the transmission area. Furthermore, although the OLED display device has been described by a way of example, it should be understood that the disclosure can also be applied to other display devices such LCD display device.

Those skilled in the art will understand that the present disclosure may be changed and modified in various ways without departing from the technical spirit of the present disclosure through the above-described contents. Accordingly, the technical scope of the present disclosure is not limited to the contents described in the detailed description of the specification, but should be determined by the claims.

What is claimed is:

1. A display device, comprising:
a first electrode of a (1-1)-th subpixel, a first electrode of a (1-2)-th subpixel, a first electrode of a (2-1)-th subpixel, and a first electrode of a (2-2)-th subpixel;
a (1-1)-th welding electrode which is positioned in a layer identical with the first electrode of the (1-1)-th subpixel and connected to the first electrode of the (1-1)-th subpixel, a (1-2)-th welding electrode which is positioned in a layer identical with the first electrode of the (1-2)-th subpixel and connected to the first electrode of the (1-2)-th subpixel, a (2-1)-th welding electrode which is positioned in a layer identical with the first electrode of the (2-1)-th subpixel and connected to the first electrode of the (2-1)-th subpixel, and a (2-2)-th welding electrode which is positioned in a layer identical with the first electrode of the (2-2)-th subpixel and connected to the first electrode of the (2-2)-th subpixel; and
a first repair line disposed under at least one of the (1-1)-th welding electrode and the (2-1)-th welding electrode, and a second repair line disposed under at least one of the (1-2)-th welding electrode and the (2-2)-th welding electrode.

2. The display device of claim 1, wherein the (1-1)-th subpixel, the (1-2)-th subpixel, the (2-1)-th subpixel, and the (2-2)-th subpixel are sequentially arranged in a first direction, and
wherein the first repair line and the second repair line are extended in the first direction.

3. The display device of claim 1, wherein the (1-1)-th subpixel and the (2-1)-th subpixel emit light of a first color, and the (1-2)-th subpixel, and the (2-2)-th subpixel emit light of a second color different from the first color.

4. The display device of claim 1, wherein the first repair line is positioned on a different layer from the (1-1)-th welding electrode and the (2-1)-th welding electrode with at least one insulating layer interposed therebetween, and
wherein the first repair line is connected to one of the (1-1)-th welding electrode and the (2-1)-th welding electrode through an open hole penetrating the at least one insulating layer.

5. The display device of claim 1, wherein the first repair line is electrically separated from the (1-1)-th welding electrode and the (2-1)-th welding electrode with at least one insulating layer interposed therebetween.

6. The display device of claim 1, wherein the second repair line is positioned on a different layer from the (1-2)-th welding electrode and the (2-2)-th welding electrode with at least one insulating layer interposed therebetween, and
wherein the second repair line is connected to one of the (1-2)-th welding electrode and the (2-2)-th welding electrode through an open hole penetrating the at least one insulating layer.

7. The display device of claim 1, wherein the second repair line is electrically separated from the (1-2)-th welding electrode and the (2-2)-th welding electrode with at least one insulating layer interposed therebetween.

8. The display device of claim 1, further comprising:
a substrate;
a light shielding layer positioned over the substrate;
a buffer layer positioned disposed over the light shielding layer;
a semiconductor layer positioned over the buffer layer;
an interlayer dielectric layer positioned over the semiconductor layer;

a source electrode and a drain electrode disposed over the interlayer dielectric layer;
a passivation film positioned over the source electrode and the drain electrode; and
an overcoat layer positioned over the passivation film,
wherein the first electrode of the (1-1)-th subpixel, the first electrode of the (1-2)-th subpixel, the first electrode of the (2-1)-th subpixel, the first electrode of the (2-2)-th subpixel, the (1-1)-th welding electrode, the (1-2)-th welding electrode, the (2-1)-th welding electrode, and the (2-2)-th welding electrode are disposed over the overcoat layer.

9. The display device of claim 8, wherein the first repair line is positioned in a layer identical with a layer of the source electrode and the drain electrode over the interlayer dielectric layer.

10. The display device of claim 8, wherein the second repair line is positioned in a layer identical with a layer of the light shielding layer over the substrate.

11. A display device comprising an emission area and a repair area, comprising:
a (1-1)-th subpixel and a (2-1)-th subpixel arranged in a first direction defined in the emission area;
a (1-1)-th welding electrode connected to a first electrode of the (1-1)-th subpixel, a (2-1)-th welding electrode connected to a first electrode of the (2-1)-th subpixel defined in the repair area which disposed surround the emission area;
a first repair line extended in the first direction, the first repair line is positioned on a different layer from the (1-1)-th welding electrode and the (2-1)-th welding electrode with a group of insulating layer interposed therebetween; and at least one insulating layer of the group of the insulating layer includes a (1-1)-th open hole, part of the (1-1)-th welding electrode is positioned within the (1-1)-th open hole, and the (1-1)-th welding electrode and the one end of the first repair line are electrically separated.

12. The display device of claim 11, further comprising a (1-2)-th subpixel and a (2-2)-th subpixel arranged in the first direction in the emission area, and a (1-2)-th welding electrode connected to a first electrode of the (1-2)-th subpixel, a (2-2)-th welding electrode connected to a first electrode of the (2-2)-th subpixel, and a second repair line extended in the first direction in the repair area.

13. The display device of claim 12, further comprising:
a substrate;
a light shielding layer positioned over the substrate;
a buffer layer positioned disposed over the light shielding layer;
a semiconductor layer positioned over the buffer layer;
an interlayer dielectric layer positioned over the semiconductor layer;
a source electrode and a drain electrode disposed over the interlayer dielectric layer;
a passivation film positioned over the source electrode and the drain electrode; and
an overcoat layer positioned over the passivation film.

14. The display device of claim 13, wherein the first repair line is positioned in a layer identical with a layer of the source electrode and the drain electrode over the interlayer dielectric layer.

15. The display device of claim 13, wherein the second repair line is positioned in a layer identical with a layer of the light shielding layer over the substrate.

* * * * *